United States Patent
Ohkuri et al.

(10) Patent No.: US 7,132,884 B2
(45) Date of Patent: Nov. 7, 2006

(54) POWER AMPLIFICATION DEVICE

(75) Inventors: Kazunobu Ohkuri, Kanagawa (JP); Toshihiko Masuda, Tokyo (JP)

(73) Assignee: Sony Corporation, Tokyo (JP)

(*) Notice: Subject to any disclaimer, the term of this patent is extended or adjusted under 35 U.S.C. 154(b) by 98 days.

(21) Appl. No.: 10/514,178

(22) PCT Filed: May 1, 2003

(86) PCT No.: PCT/JP03/05576

§ 371 (c)(1),
(2), (4) Date: Nov. 10, 2004

(87) PCT Pub. No.: WO03/096527

PCT Pub. Date: Nov. 20, 2003

(65) Prior Publication Data
US 2005/0174176 A1   Aug. 11, 2005

(30) Foreign Application Priority Data
May 13, 2002  (JP)  ............................ 2002-137778

(51) Int. Cl.
H03F 3/38 (2006.01)
(52) U.S. Cl. .................................... 330/10; 330/124 R
(58) Field of Classification Search .................. 330/10, 330/207 A, 251, 146, 124 R
See application file for complete search history.

(56) References Cited

U.S. PATENT DOCUMENTS 6,593,806 B1 * 7/2003 Melanson .................... 330/10

FOREIGN PATENT DOCUMENTS

| EP | 1 014 566 A2 | 6/2000 |
|---|---|---|
| JP | 7-15248 A | 1/1995 |
| JP | 2000-196376 A | 7/2000 |

OTHER PUBLICATIONS

European Search Report—Sony Corporation

* cited by examiner

Primary Examiner—Robert Pascal
Assistant Examiner—Hieu Nguyen
(74) Attorney, Agent, or Firm—Wolf, Greenfield & Sacks, P.C.

(57) ABSTRACT

A class D power amplifier (1) switches a power supply voltage $V_{DD}$ at high-speed in response to an input digital audio signal $P_{in}$ to power-amplify the digital audio signal $P_{in}$, and supplies a speaker (2) with the amplified signal. In the case of being incorporated in an AM receiver formed integrally with an AM tuner (3) for receiving AM broadcasts, the class D power amplifier (1) can reduces influence of reception interference with respect to the AM tuner (3). As a result, it is possible to provide a power amplifier that can suppress unnecessary radiation to reduce reception interference with respect to the tuner, not by changing a carrier frequency, but by controlling the drive signal generation systems.

4 Claims, 13 Drawing Sheets

POWER AMPLIFICATION DEVICE

TECHNICAL FIELD

The present invention relates to a power amplifier, and more particularly, to a power amplifier like a class D amplifier for use in amplifying audio power.

The present application claims priority from Japanese Patent Application No. 2002-137778 filed on May 13, 2002, the content of which is hereby incorporated by reference into this application.

BACKGROUND ART

There is available a so-called class D amplifier as an audio power amplifier. The class D amplifier amplifies power by high-voltage/high-speed switching. Since the class D amplifier switches a supply voltage $+V_{DD}$ to generate an output voltage, radiation is generated by rising and falling edges of the output voltage. Further, the supply voltage $+V_{DD}$ is a high voltage of e.g., 20 to 50 V at the switching time, so that the radiation becomes significantly large.

In the case where the class D power amplifier as mentioned above is integrated with a receiver or disposed at the vicinity of a receiver, like the case of a car audio system, radiation generated by rising and falling edges of the output voltage may interfere with reception of e.g., AM broadcasting services.

As a technique to cope with the above problem, a class D amplifier described in, for example, Jpn. Pat. Appln. Laid-Open Publication No. 6-29757 was disclosed. In this class D amplifier, a carrier controller outputs a tuning signal having the frequency corresponding to tuner channel selection, as well as a carrier control signal for switching a time constant of a differential integrator. The carrier control signal switches an oscillating frequency of a closed-loop circuit, i.e., a switching frequency of a pulse amplifier. As a result, the frequency of the carrier signal of the closed-loop circuit does not interfere with the tuning signal of the tuner.

However, in the above class D amplifier disclosed in Jpn. Pat. Appln. Laid-Open Publication No. 6-29757, a carrier frequency of switching amplification is changed according to a received frequency. As a result, it is difficult to perform a switching operation with high time axis precision using, e.g., a crystal oscillator, which may lead to deterioration in audio characteristics.

DISCLOSURE OF THE INVENTION

An object of the present invention is to provide a power amplifier that suppresses unnecessary radiation and thereby reduces reception interference with respect to a tuner not by changing a carrier frequency, like the case of the conventional class D amplifier, but by controlling a drive signal generation system.

A power amplifier, which is proposed to achieve the above object, having at least a push-pull means obtained by push-pull connecting a pair of switching devices, and amplifying the power of an input signal using the push-pull means, comprises a drive signal generation means for producing a pulse width modulation signal which represents the level of the input signal by a pulse width, and generating, based on the pulse width modulation signal, a drive signal to be supplied to the push-pull means, and selectively switches a drive signal generation system in the drive signal generation means according to a received frequency of a tuner for receiving radio broadcasts, wherein the push-pull means generates an output signal based on the drive signal generated according to the selected drive signal generation system, and a power amplified signal is obtained from the output signal.

As described above, the power amplifier according to the present invention reduces reception interference with respect to the tuner not by changing a carrier frequency of switching amplification in the class D amplifier, for example, but by controlling the drive signal generation system.

The amplifier according to the present invention may two push-pull means and two drive signal generation means for supplying, respectively, the drive signals to the two push-pull means. In this case, the respective drive signals generated by the two drive signal generation means are supplied to the two push-pull means to obtain two output signals, from which a power amplified signal is obtained.

The drive signal generation system that is selectively switched in the power amplifier includes a first and second systems, the first system generating a drive signal that changes at separation points of each cycle period of the pulse width modulation signal, and the second system generating a drive signal that does not change at separation points of each cycle period.

BEST MODE FOR CARRYING OUT THE INVENTION

Embodiments of the present invention will be described below with reference to the accompanying drawings. A first embodiment relates to a class D power amplifier 1 shown in FIG. 1. The class D power amplifier 1 switches, at high-speed, a supply voltage $V_{DD}$ in response to an input digital audio signal $P_{in}$ to power-amplify the digital audio signal $P_{in}$ and supplies a speaker 2 with the amplified signal. In a so-called AM receiver formed integrally with an AM tuner 3 for receiving, e.g., AM broadcasting services, the class D power amplifier 1 can reduce influence of reception interference with respect to the AM tuner 3.

Figure 1:
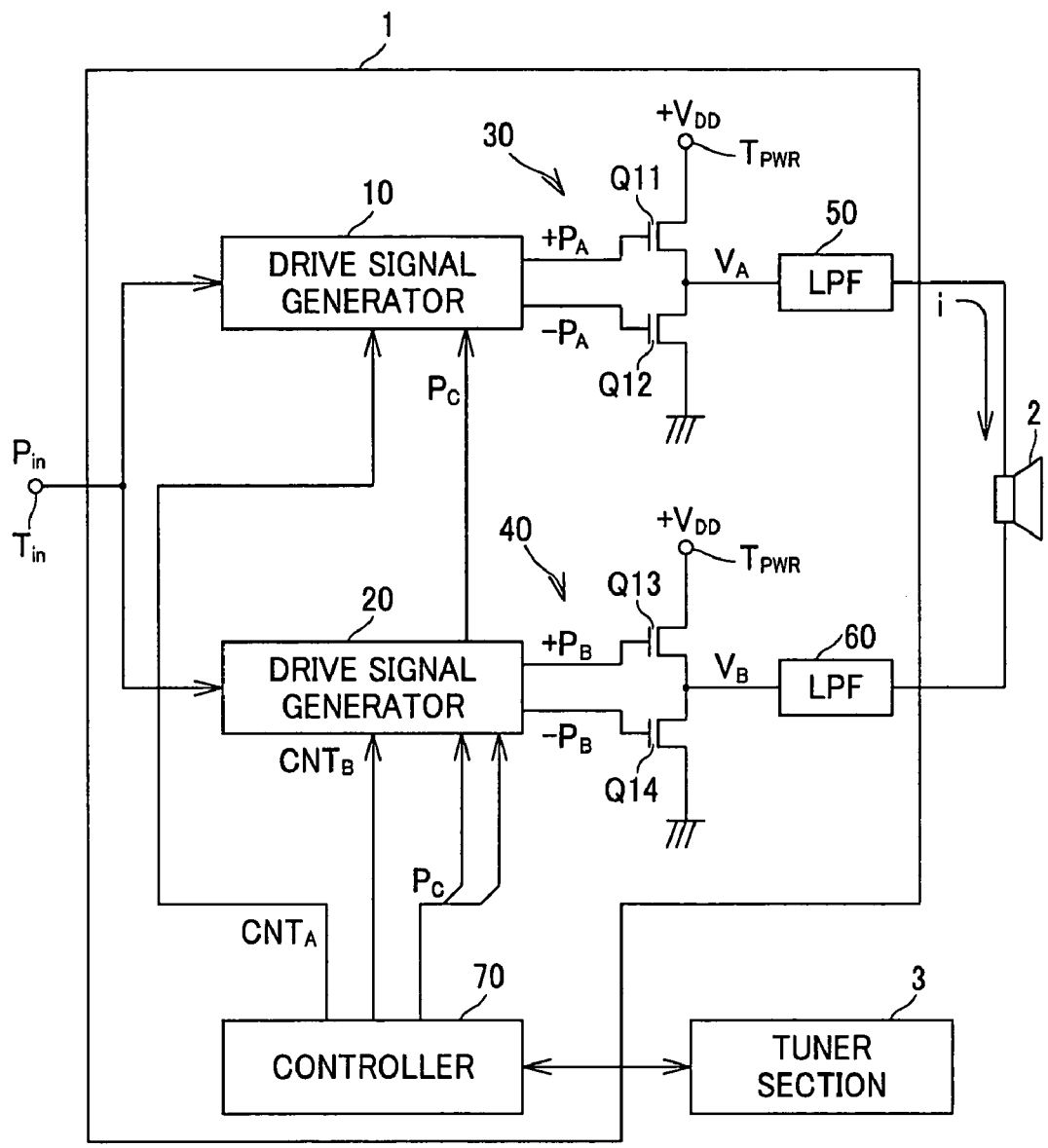
FIG. 1 is a view showing the configuration of a class D power amplifier according to a first embodiment.

In FIG. 1, a digital audio signal $P_{in}$ of e.g., 16 bits is input to the class D power amplifier 1 through an input terminal $T_{in}$. The digital audio signal $P_{in}$ is supplied to a drive signal generator 10 and a drive signal generator 20.

The drive signal generator 10 generates two types of drive signals $+P_{A1}$ and $-P_{A1}$, or $+P_{A2}$ and $-P_{A2}$ according to two drive generation systems to be described later. The drive signal generator 20 also generates two types of drive signals $+P_{B1}$ and $-P_{B1}$, or $+P_{B2}$ and $-P_{B2}$ according to two drive generation systems.

The two types of drive signals $+P_{A1}$ and $-P_{A1}$ or $+P_{A2}$ and $-P_{A2}$ generated by the drive signal generator 10 are supplied to each gate of a pair of switching devices, e.g., n-channel MOS-FETs (Q11, Q12). The two types of drive signals $+P_{B1}$ and $-P_{B1}$, or $+P_{B2}$ and $-P_{B2}$ generated by the drive signal generator 20 are supplied to each gate of MOS-FETs (Q13, Q14).

In this case, FETs (Q11, Q12) constitute a push-pull circuit 30, in which the drain of FET (Q11) is connected to a power terminal $T_{PWR}$, the source thereof is connected to the drain of FET (Q12), and the source of FET (Q12) is grounded. A stable direct-current voltage $+V_{DD}$ is supplied as supply voltage to the power terminal $T_{PWR}$. The direct-current voltage $+V_{DD}$ is, e.g., 20 to 50 V.

Likewise, FETs (Q13, Q14) constitute a push-pull circuit 40, in which the drain of FET (Q13) is connected to a power terminal $T_{PWR}$, the source thereof is connected to the drain of FET (Q14), and the source of FET (Q14) is grounded.

The source of FET (Q11) and the drain of FET (Q12) in the push-pull circuit 30 are connected to one end of the speaker 2 provided outside of the class D amplifier through a low-pass filter (LPF) 50. The source of FET (Q13) and the drain of FET (Q14) in the push-pull circuit 40 are connected to the other end of the outside speaker 2 through a low-pass filter (LPF) 60.

The drive generation system to be used in the drive signal generators 10 and 20 is selected by a controller 70 based on a received frequency of the tuner section 3. That is, the drive signal generators 10 and 20 generate, as needed, the two types of drive signals respectively according to the drive signal generation system that the controller 70 has selected based on a received frequency of the tuner section 3.

Figure 2:
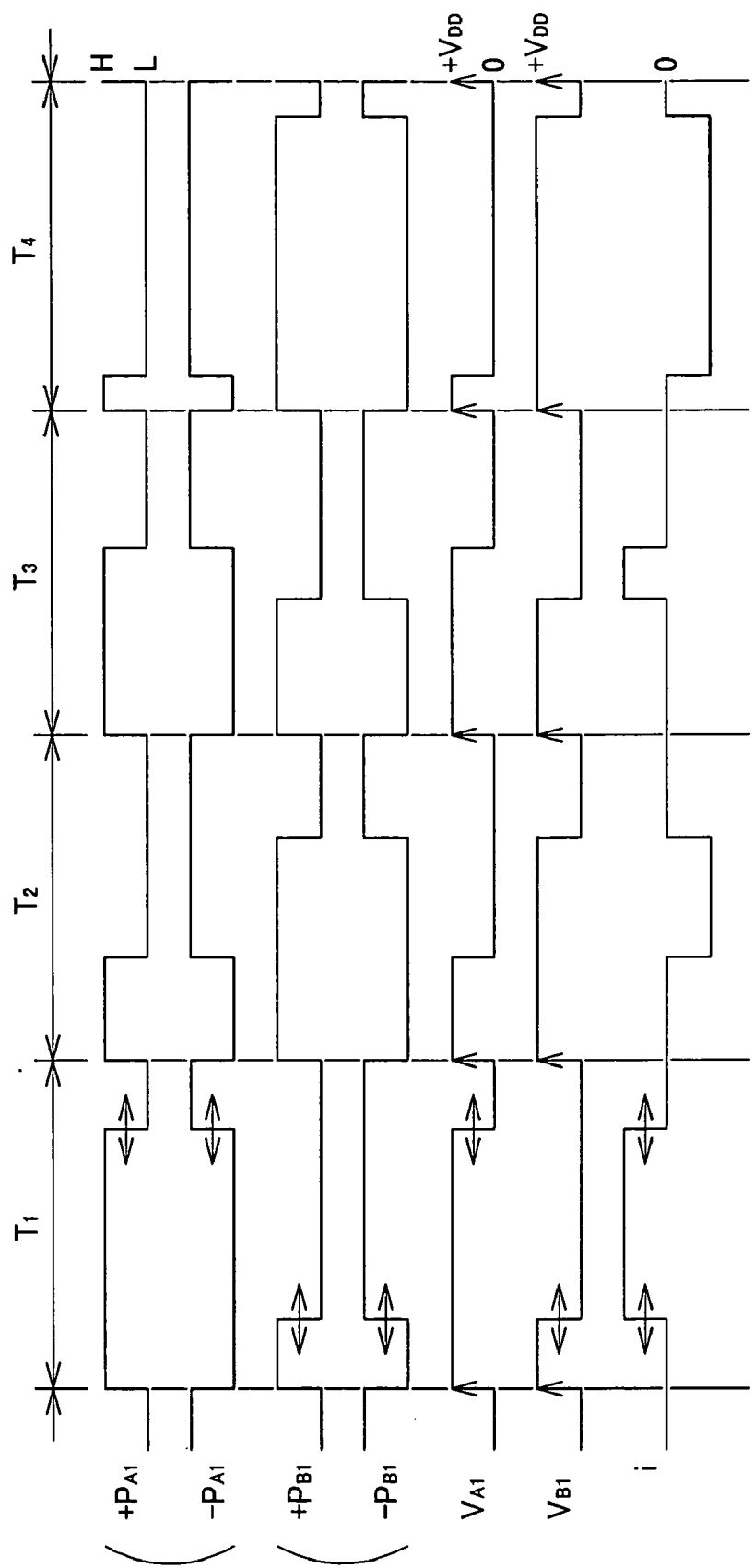
FIG. 2 is a timing chart for explaining a first drive signal generation system of two drive signal generation systems executed in two drive signal generators of the class D power amplifier.

A concrete example of the two types of drive signal generation systems executed in the drive signal generators 10 and 20 will be described below. Firstly, according to a first drive signal generation system (first drive signal generation system of the first embodiment), the drive signal generator 10 converts the digital audio signal $P_{in}$ supplied through the input terminal $T_{in}$ into a PWM signal (drive signal) $+P_{A1}$ as shown in FIG. 2. The drive signal generator 20 converts the digital audio signal $P_{in}$ into a PWM signal (drive signal) $+P_{B1}$ as shown in FIG. 2. In the first drive signal generation system according to the first embodiment, the PWM signal functions as the drive signal. Thus, PWM signal is referred to as drive signal, here.

Figure 3:
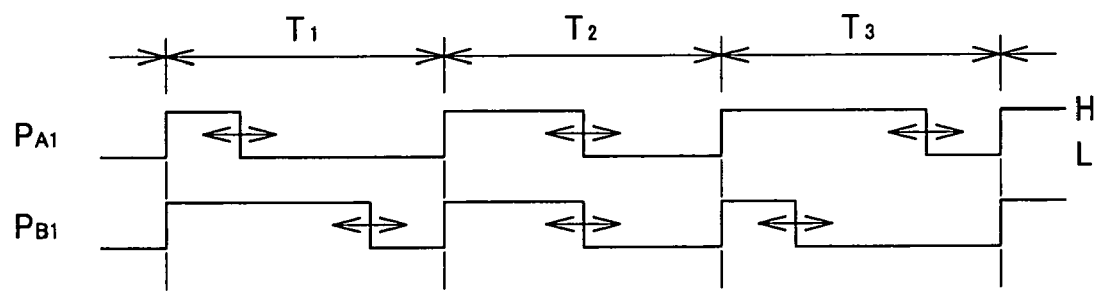
FIG. 3 is a timing chart for explaining PWM modulation.

In this case, a pulse width of each of the drive signals $+P_{A1}$ and $+P_{B1}$ changes according to the level (instantaneous level of the signal obtained by DA-converting the signal $P_{in}$, the same applies to the following description) of the input signal $P_{in}$. More specifically, as shown in FIG. 3, a pulse width of the drive signal $+P_{A1}$ corresponds to the level of the input signal $P_{in}$, and a pulse width of the drive signal $+P_{B1}$ corresponds to a twos complement of the level of the input signal $P_{in}$. Further, the rising time of each of the drive signals $+P_{A1}$ and $+P_{B1}$ is fixed to the starting point of one cycle period $T_i$ (i=1, 2, 3, 4 . . . ) of the drive signals $+P_{A1}$ and $+P_{B1}$, that is, fixed at one side, and the falling time thereof changes according to the level of the input signal $P_{in}$.

Assuming that a carrier frequency $f_c$ (=$1/T_i$) of the drive signals $+P_{A1}$ and $+P_{B1}$ is e.g., 16 times a sampling frequency $f_s$ of the input digital audio signal $P_{in}$, where $f_s$=48 kHz, $$f_c = 16 f_s = 16 \times 48 \text{ kHz} = 768 \text{ kHz}$$

is satisfied.

Figure 4:
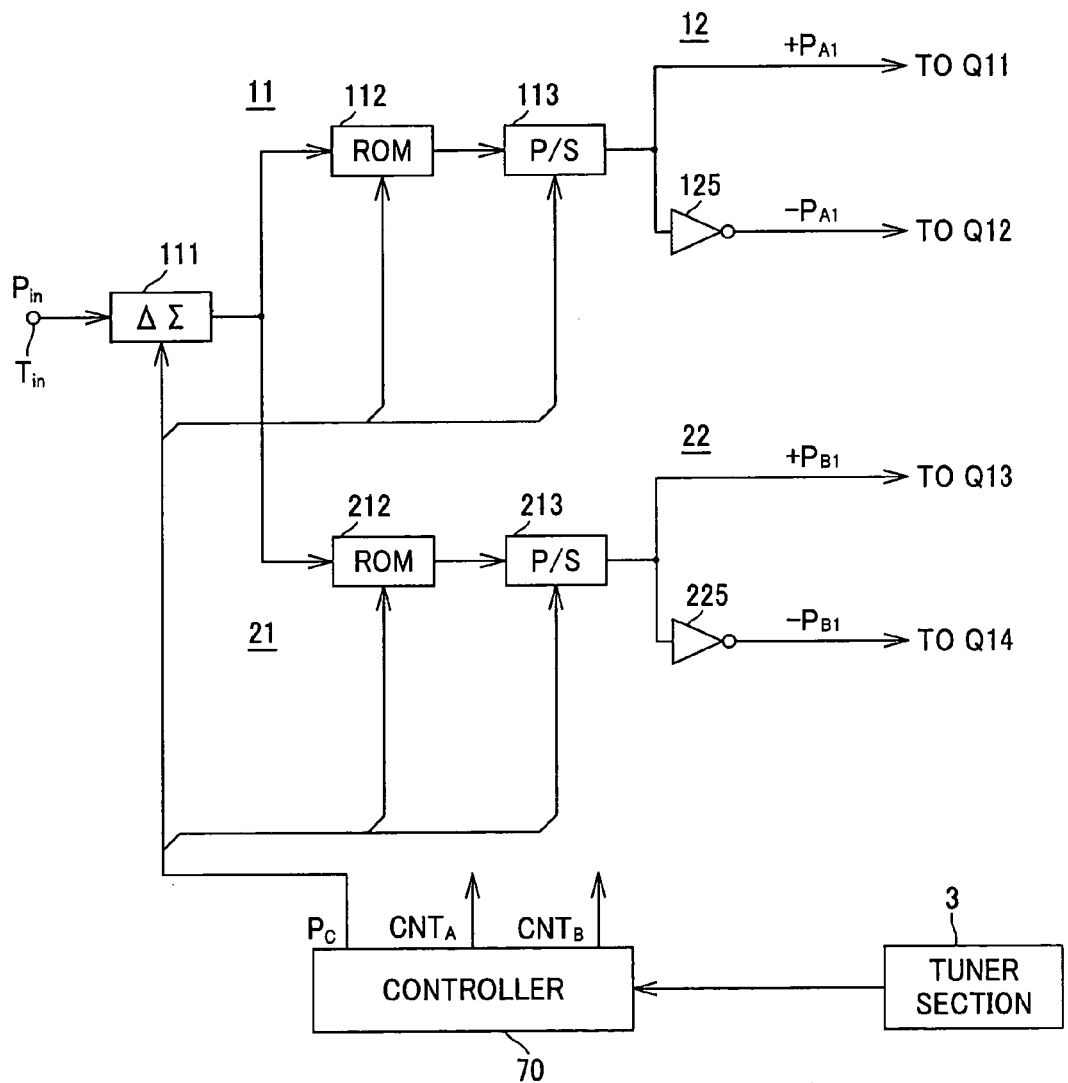
FIG. 4 is a view showing an equivalent circuit at the time of execution of the first drive signal generation system according to the first embodiment.

In order to generate the above drive signals $+P_{A1}$ and $+P_{B1}$, the first drive signal generation system according to the first embodiment operates equivalently to the circuit as shown in FIG. 4, in the drive signal generators 10 and 20.

The drive signal generator 10 virtually includes a PWM modulation circuit 11 and a drive circuit 12 shown in FIG. 4 by executing the first drive signal generation system. The PWM modulation circuit 11 converts e.g., a 16-bit audio signal into the drive signal $+P_{A1}$ of FIG. 2. The drive circuit 12 supplies each gate of the pair of n-channel MOS-FETs (Q11, Q12) that constitute the push-pull circuit 40 with the PWM modulation signal $+P_{A1}$ or its inverted signal $-P_{A1}$.

In order to generate the drive signal $+P_{A1}$, the PWM modulation circuit 11 is configured as follows. That is, the digital audio signal $P_{in}$ from the input terminal $T_{in}$ is supplied to a $\Delta\Sigma$ modulation circuit 111 and converted into a digital audio signal whose bit number is reduced with quantization noise in an audible frequency band suppressed, e.g., a digital audio signal whose quantization frequency (=$f_c$) is 16 $f_s$, and whose quantization bit number is 6. The converted digital audio signal is supplied to an ROM 112 and converted into parallel digital data corresponding to the quantization level of the digital signal. The parallel digital data is supplied to a shift resister 113 and converted into a direct signal, i.e., the drive signal $+P_{A1}$.

The drive circuit 12 inverts the PWM modulation signal $+P_{A1}$ by means of an inverter 125 in order to generate the inverted signal $-P_{A1}$.

The drive signal generator 20 virtually includes a PWM modulation circuit 21 and a drive circuit 22 shown in FIG. 4 by executing the first drive signal generation system. The PWM modulation circuit 21 converts a 16-bit audio signal into the drive signal $+P_{B1}$ of FIG. 2. The drive circuit 22 supplies each gate of the pair of n-channel MOS-FETs (Q13, Q14) that constitute the push-pull circuit 40 with the PWM modulation signal $+P_{B1}$ or its inverted signal $-P_{B1}$.

In order to generate the drive signal $+P_{B1}$, the PWM modulation circuit 21 converts, by means of the E modulation circuit 111, the digital audio signal $P_{in}$ from the input terminal $T_{in}$ into a digital audio signal whose bit number is reduced with quantization noise in an audible frequency band suppressed, e.g., a digital audio signal whose quantization frequency (=$f_c$) is 16 $f_s$, and whose quantization bit number is 6. The converted digital audio signal is supplied to an ROM 212 and converted into parallel digital data corresponding to the quantization level of the digital signal. The parallel digital data is supplied to a shift resister 213 and converted into the drive signal +$P_{B1}$.

The drive circuit 22 inverts the PWM modulation signal +$P_{B1}$ by means of an inverter 225 in order to generate the inverted signal −$P_{B1}$.

At this time, various timing signals are generated in a timing signal generation circuit in the controller 70 and supplied to the above circuits.

As shown in FIG. 2, when +$P_{A1}$="H", −$P_{A1}$="L". In this case, FET (Q11) shown in FIG. 1 is turned ON and FET (Q12) is turned OFF, so that the voltage $V_{A1}$ at the connection point between FETs (Q11, Q12) becomes a voltage +$V_{DD}$, as shown in FIG. 2. On the other hand, when +$P_{A1}$="L", −$P_{A1}$="H". In this case, FET (Q11) is turned OFF and FET (Q12) is turned ON, so that the voltage $V_{A1}$ becomes 0.

Likewise, as shown in FIG. 2, when +$P_{B1}$="H", −$P_{B1}$="L". In this case, FET (Q13) is turned ON and FET (Q14) is turned OFF, so that the voltage $V_{B1}$ at the connection point between FETs (Q13, Q14) becomes a voltage +$V_{DD}$, as shown in FIG. 2. On the other hand, when +$P_{B1}$="L", −$P_{B1}$="H". In this case, FET (Q13) is turned OFF and FET (Q14) is turned ON, so that the voltage $V_{B1}$ becomes 0.

In the time period during which $V_{A1}$=+$V_{DD}$ and $V_{B1}$=0, a current i flows from the connection point between FETs (Q11, Q12) through the low-pass filter 50, speaker 2, and low-pass filter 60, to the connection point between FETs (Q13, Q14), as shown in FIGS. 1 and 2.

In the time period during which $V_{A1}$=0 and $V_{B1}$=+$V_{DD}$, a current i flows, in the opposite direction to the above, from the connection point between FETs (Q13, Q14) through the low-pass filter 60, speaker 2, and low-pass filter 50, to the connection point between FETs (Q11, Q12). In the time period during which $V_{A1}$=$V_{B1}$=+$V_{DD}$ and the time period during which $V_{A1}$=$V_{B1}$=0, the current i does not flow. That is, the push-pull circuits 30 and 40 constitute a BTL (Bridge-Tied Load) circuit.

The time period during which the current i flows changes in accordance with the time period during which the original drive signal +$P_{A1}$ or +$P_{B1}$ rises, and the current i is integrated by the low-pass filter 50 or 60 when the current i flows through the speaker 2. As a result, the current i that flows through the speaker 2 becomes a power-amplified analog current that corresponds to the level of the input signal $P_{in}$. That is, the power-amplified output is supplied to the speaker 2.

Thus, the drive signal generators 10 and 20 of FIG. 1 operate equivalently to the circuit having the configuration shown in FIG. 4 using the first drive signal generation system according to the first embodiment. As a result, FETs (Q11 to Q14) of the class D power amplifier 1 switch the power supply voltage $V_{DD}$ in response to the input digital audio signal $P_{in}$ to generate a power-amplified output, thereby improving efficiency and obtaining a large output.

The class D power amplifier 1, which includes the drive signal generators 10 and 20 shown in FIG. 1 functioning as the circuit having the configuration of FIG. 4 by executing the first drive signal generation system, switches the power supply voltage +$V_{DD}$ at high-speed to generate the output voltages $V_{A1}$ and $V_{B1}$. Therefore, radiation is generated by rising and falling edges of each of the output voltages $V_{A1}$ and $V_{B1}$. Further, the power supply voltage +$V_{DD}$ is a high voltage of e.g., 20 to 50 V at switching time, so that the radiation becomes significantly large. The carrier frequency $f_c$ of the drive signals +$P_{A1}$ and +$P_{B1}$ is e.g., 768 kHz, as described above, which is contained in the medium wave broadcasting band e.g., AM radio broadcast band.

In the case where the class D power amplifier 1 as mentioned above is integrated with an AM broadcast receiver or disposed at the vicinity of the AM broadcast receiver, like the case of a car audio system, the radiation generated by rising and falling edges of the each of the output voltages $V_{A1}$ and $V_{B1}$ may interfere with reception of e.g., AM broadcasting services depending on the received frequency of the AM broadcasting services.

To cope with the above problem, in the class D power amplifier 1, the controller 70 selects a second drive signal generation system to be described later as well as the first drive signal generation system according to a received frequency in the tuner 3 and allows the drive signal generators 10 and 20 to execute the selected system.

Figure 5:
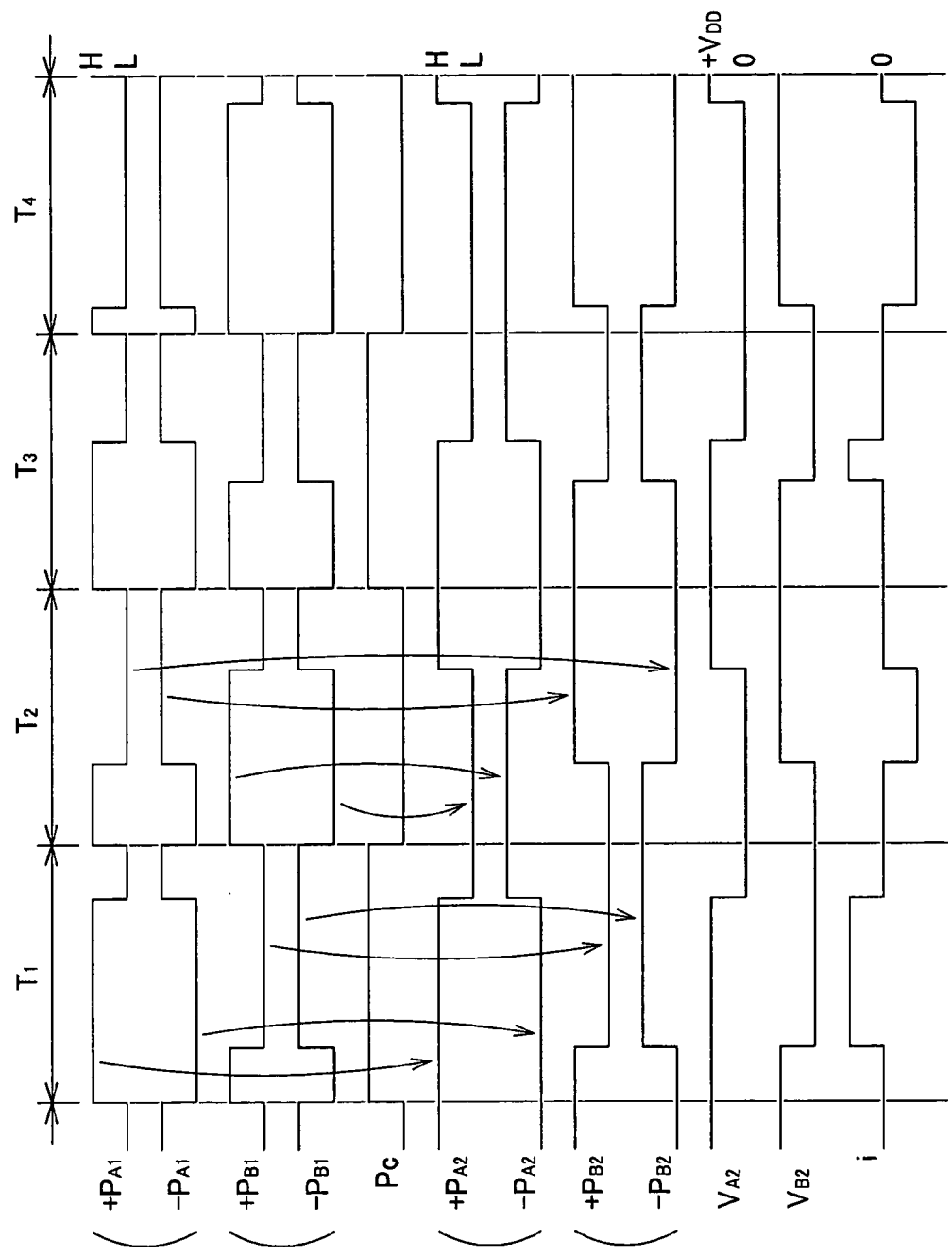
FIG. 5 is a timing chart for explaining a second drive signal generation system of two drive signal generation systems executed in the two drive signal generators of the class D power amplifier.

According to the second drive signal generation system (second drive signal generation system of the first embodiment), the drive signal generator 10 converts the digital audio signal $P_{in}$ supplied through the input terminal $T_{in}$ into the drive signal +$P_{A2}$ shown in FIG. 5. The drive signal generator 20 converts the digital audio signal $P_{in}$ into the drive signal +$P_{B2}$ shown in FIG. 5. In the second drive signal generation system according to the first embodiment, the drive signal is generated from the PWM signal.

Figure 6:
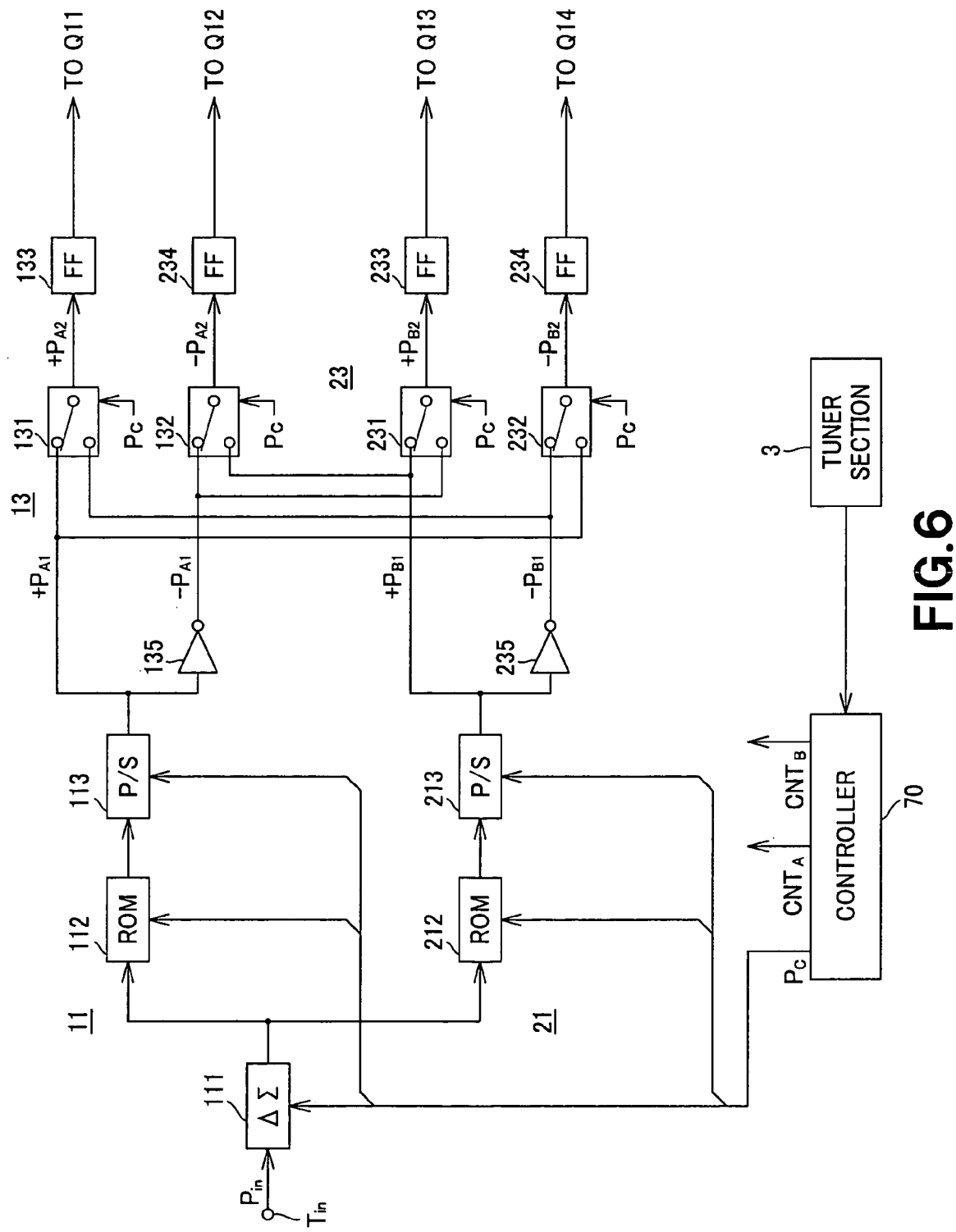
FIG. 6 is a view showing an equivalent circuit at the time of execution of the second drive signal generation system according to the first embodiment.

In order to generate the above drive signals +$P_{A2}$ and +$P_{B2}$, the second drive signal generation system according to the first embodiment operates equivalently to the circuit as shown in FIG. 6, in the drive signal generators 10 and 20.

The drive signal generator 10 virtually includes a PWM modulation circuit 11 and a drive circuit 13 shown in FIG. 6 by executing the second drive, signal generation system. The PWM modulation circuit 11 has the same configuration as that shown in FIG. 4, and converts e.g., a 16-bit audio signal into the PWM signal +$P_{A1}$ of FIG. 5. The drive circuit 13 converts the PWM modulation signal +$P_{A1}$ or its inverted signal −$P_{A1}$ into the drive signal +$P_{A2}$, and −$P_{A2}$ shown in FIG. 5, which are supplied to each gate of the pair of n-channel MOS-FETs (Q11, Q12) that constitute the push-pull circuit 40.

The configuration of the PWM modulation circuit 11 is as described above, and the description thereof will be omitted. The drive signal +$P_{A2}$ that has been converted into a direct signal by a shift register 113 is supplied to the drive circuit 13.

The drive signal generator 20 virtually includes a PWM modulation circuit 21 and a drive circuit 23 shown in FIG. 6 by executing the second drive signal generation system. The PWM modulation circuit 21 has the same configuration as that shown in FIG. 4, and converts e.g., a 16-bit audio signal into the PWM signal +$P_{B1}$ of FIG. 5. The drive circuit 23 converts the PWM modulation signal +$P_{B1}$ or its inverted signal −$P_{B1}$ into the drive signal +$P_{B2}$, and −$P_{B2}$ shown in FIG. 5, which are supplied to each gate of the pair of n-channel MOS-FETs (Q13, Q14) that constitute the push-pull circuit 50.

The configuration of the PWM modulation circuit 21 is as described above, and the description thereof will be omitted. The drive signal +$P_{B1}$ that has been converted into a direct signal by a shift register 213 is supplied to the drive circuit 23.

The drive circuits 13 and 23 have the configuration as shown in FIG. 6 to generate the drive signals $+P_{A2}$, $-P_{A2}$ and drive signals $+P_{B2}$, $-P_{B2}$, respectively. That is, the PWM signal $+P_{A1}$ is supplied to selector circuits 131 and 132, as well as to an inverter 135, where $+P_{A1}$ is allowed to become the PWM signal $-P_{A1}$ whose level has been inverted. The PWM signal $-P_{A1}$ is supplied to the selector circuits 132 and 231. Further, the PWM signal $+P_{B1}$ is supplied to the selector circuits 231 and 132, as well as to an inverter 235, where $+P_{B1}$ is allowed to become the PWM signal $-P_{B1}$ whose level has been inverted. The PWM signal $-P_{B1}$ is supplied to the selector circuits 232 and 131.

Further, a signal $P_c$ whose level is inverted every one cycle period $T_i$ (i=1, 2, 3, 4 . . . ) as shown in FIG. 5, is taken out from the timing signal generation circuit of the controller 70 and supplied to each of the selector circuits 131, 132, 231, 232, as a switching control signal for the selector circuits.

Thus, the signals $+P_{A1}$, $-P_{A1}$ are taken out, respectively, from the selectors 131, 132 in the time period $T_1$ and $T_3$ during which $P_c$="H", as the drive voltages $+P_{A2}$, $-P_{A2}$, as shown in FIG. 5. On the other hand, the signals $-P_{B1}$, $+P_{B1}$ are taken out in the time period $T_2$ and $T_4$ during which $P_c$="L" as the drive voltages $+P_{A2}$, $-P_{A2}$, as shown in FIG. 5.

Further, the signals $+P_{B1}$, $-P_{B1}$ are taken out, respectively, from the selectors 231, 232 in the time period $T_1$ and $T_3$ during which $P_c$="H", as the drive voltages $+P_{B2}$, $-P_{B2}$, as shown in FIG. 5. On the other hand, the signals $-P_{A1}$, $+P_{A1}$ are taken out in the time period $T_2$ and $T_4$ during which $P_c$="L", as the drive voltages $+P_{B2}$, $-P_{B2}$, as shown in FIG. 5.

After the drive voltages $+P_{A2}$, $-P_{A2}$, $+P_{B2}$, $-P_{B2}$ are shaped, respectively, through flip-flop circuits 133, 134, 233, 234, the drive voltages $+P_{A2}$, $-P_{A2}$ are supplied, respectively, to the gates of the FETs Q11, Q12 that constitute the push-pull circuit 30, and the drive voltages $+P_{B2}$, $-P_{B2}$ are supplied, respectively, to the gates of the FETs Q13, Q14 that constitute the push-pull circuit 40.

As shown in FIG. 5, when $+P_{A2}$="H", $-P_{A2}$="L". In this case, FET (Q11) is turned ON and FET (Q12) is turned OFF, so that the voltage $V_{A2}$ at the connection point between FETs (Q11,Q12) becomes a voltage $+V_{DD}$. On the other hand, when $+P_{A2}$="L", $-P_{A2}$="H". In this case, FET (Q11) is turned OFF and FET (Q12) is turned ON, so that the voltage $V_{A2}$ becomes 0.

Likewise, when $+P_{B2}$="H", $-P_{B2}$="L". In this case, FET (Q13) is turned ON and FET (Q14) is turned OFF, so that the voltage $V_{B2}$ at the connection point between FETs (Q13, Q14) becomes a voltage $+V_{DD}$. On the other hand, when $+P_{B2}$="L", $-P_{B2}$="H". In this case, FET (Q13) is turned OFF and FET (Q14) is turned ON, so that the voltage $V_{B2}$ becomes 0.

In the time period during which $V_{A2}$=$+V_{DD}$ and $V_{B2}$=0, a current i flows from the connection point between FETs (Q11, Q12) through the low-pass filter 50, speaker 2, and low-pass filter 60, to the connection point between FETs (Q13,Q14), as shown in FIGS. 1 and 5.

In the time period during which $V_{A2}$=0 and $V_{B2}$=$+V_{DD}$, a current i flows, in the opposite direction to the above, from the connection point between FETs (Q13, Q14) through the low-pass filter 60, speaker 2, and low-pass filter 50, to the connection point between FETs (Q11,Q12). In the time period during which $V_{A2}$=$V_{B2}$=$+V_{DD}$ and the time period during which $V_{A2}$=$V_{B2}$=0, the current i does not flow. That is, the push-pull circuits 30 and 40 constitute a BTL circuit.

The time period during which the current i flows changes in accordance with the time period during which the original PWM signal $+P_{A1}$ or $+P_{B1}$ rises, and the current i is integrated by the low-pass filter 50 or 60 when the current i flows through the speaker 2. As a result, the current i that flows through the speaker 2 becomes a power-amplified analog current that corresponds to the level of the input signal $P_{in}$. That is, the power-amplified output is supplied to the speaker 2.

As described above, the class D power amplifier 1, which includes the drive signal generators 10 and 20 of FIG. 1 functioning as the circuit of FIG. 6 by the second drive signal generation system, amplifies power by switching operation. Here, it can be seen from FIG. 5 that although the PWM signals $+P_{A1}$, $+P_{B1}$ rise every starting point of one cycle period $T_i$, the output voltages $V_{A2}$, $V_{B2}$ do not rise every starting point of one cycle period $T_i$, and that the number of rising and falling edges of the output voltages $V_{A2}$, $V_{B2}$ is ½ of the number of rising and falling edges of the output voltages $V_{A1}$, $V_{B1}$ shown in FIG. 2. Therefore, it is possible to reduce the radiation generated by the change in the output voltages $V_{A2}$ and $V_{B2}$.

Figure 7:
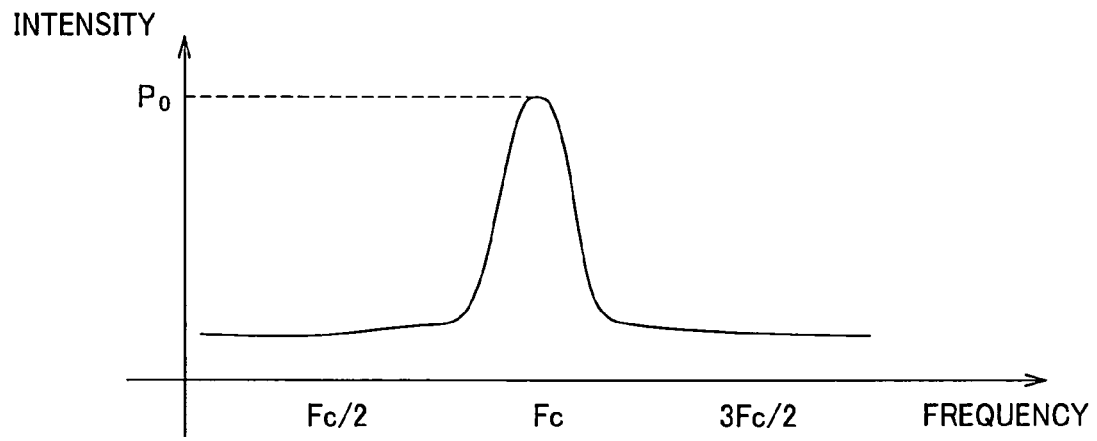
FIG. 7 is a view showing signal intensity characteristics relative to the frequency of an output voltage of a push-pull circuit according to the first drive signal generation system.
Figure 8:
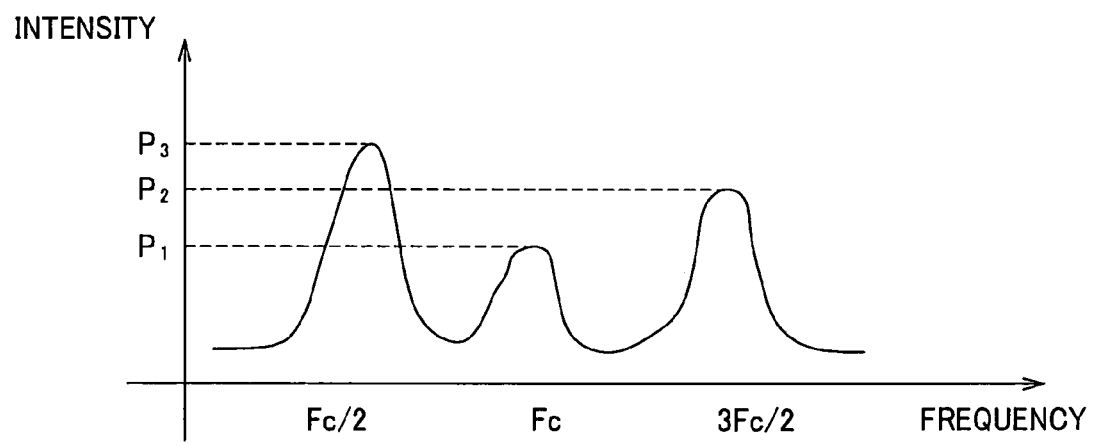
FIG. 8 is a view showing signal intensity characteristics relative to the frequency of an output voltage of a push-pull circuit according to the second drive signal generation system.

A difference in the measurement results of a spectrum between signals of the output voltage $V_{A1}$ obtained by the first drive signal generation system and the output voltage $V_{A2}$ obtained by the second drive signal generation system will be described with reference to FIGS. 7 and 8. FIG. 7 shows a change in the intensity of the signal in accordance with a change in the frequency of the signal of the output voltage $V_{A1}$. FIG. 8 shows a change in the intensity of the signal in accordance with a change in the frequency of the signal of the output voltage $V_{A2}$.

In the case of using the first drive signal generation system, the signal intensity is concentrated on the vicinity of a carrier frequency $f_c$ (=$1/T_i$=768 kHz) due to influence of the radiation to generate a large peak $P_0$, as shown in FIG. 7. As a result, when the first drive signal generation system is used, the reception frequency band centering on 768 kHz is interfered with in the AM tuner receiving AM broadcasting services. The concentration of signal intensity that may interfere with AM reception frequency band is not generated in the vicinity of $f_c/2$ (=384 kHz) and $3f_c/2$ (1,152 kHz).

In the case of using the second drive signal generation system, the signal intensity is dispersed among $f_c/2$ (=384 kHz), $f_c$ (=768 kHz), and $3f_c/2$ (1,152 kHz), as shown in FIG. 8. At $f_c/2$ (=384 kHz), and $3f_c/2$ (1,152 kHz), peaks $P_3$ and $P_2$, sizes of which are close to the size of the peak $P_0$ is generated, and at $f_c$ (=768 kHz), a peak $P_1$ having a size smaller than that of the peak $P_0$.

Therefore, when the received frequency of AM broadcasting service is close to $f_c$ (=768 kHz), the second drive signal generation system with spectrum shown in FIG. 8 is used, and whereas, when the received frequency of AM broadcasting service is close to $f_c/2$ (=384 kHz) or $3f_c/2$ (1,152 kHz), the first drive signal generation system is used. By doing this, it is possible to reduce interference to the reception of AM broadcast wave due to generation of the radiation.

In practice, the received frequency of AM broadcasting service ranges from 500 kHz to 1,700 kHz, so that $f_c/2$ (=384 kHz) can be count out. It is preferable that the first drive signal generation system be used at the received frequency of the AM tuner higher than 900 kHz, and the second drive signal generation system be used at the received frequency not higher than 900 kHz under the condition that a margin is provided in the vicinity of $f_c$ (=768 kHz) shown in FIG. 7.

To realize the above configuration, the controller 70 constantly detects whether the received frequency of the tuner section 3 becomes, automatically or manually, 900 kHz or lower. When the received frequency of the tuner section 3 becomes 900 kHz or lower, the controller 70 selects the second drive signal generation system to allow the drive signal generators 10 and 20 to operate according to the selected system. When the received frequency becomes higher than 900 kHz, the controller 70 selects the first drive signal generation system to allow the drive signal generators to operate according to it. As a result, the class D power amplifier 1 according to the present embodiment can reduce reception interference with respect to a tuner section 3 for receiving AM broadcasting services.

The class D power amplifier according to the first embodiment can achieve its object only by switching the PWM modulation drive signal generation systems executed in a digital circuit such as the drive signal generators 10 and 20. Therefore, it is possible to use a clock with high time axis precision such as a crystal oscillator, so that audio characteristics are not deteriorated.

While the two drive signal generators 10 and 20 are used in FIG. 1, it is possible to integrate the two generators into one digital signal processor (DSP). As a result, reception interference can be reduced with a simple structure.

Figure 9:
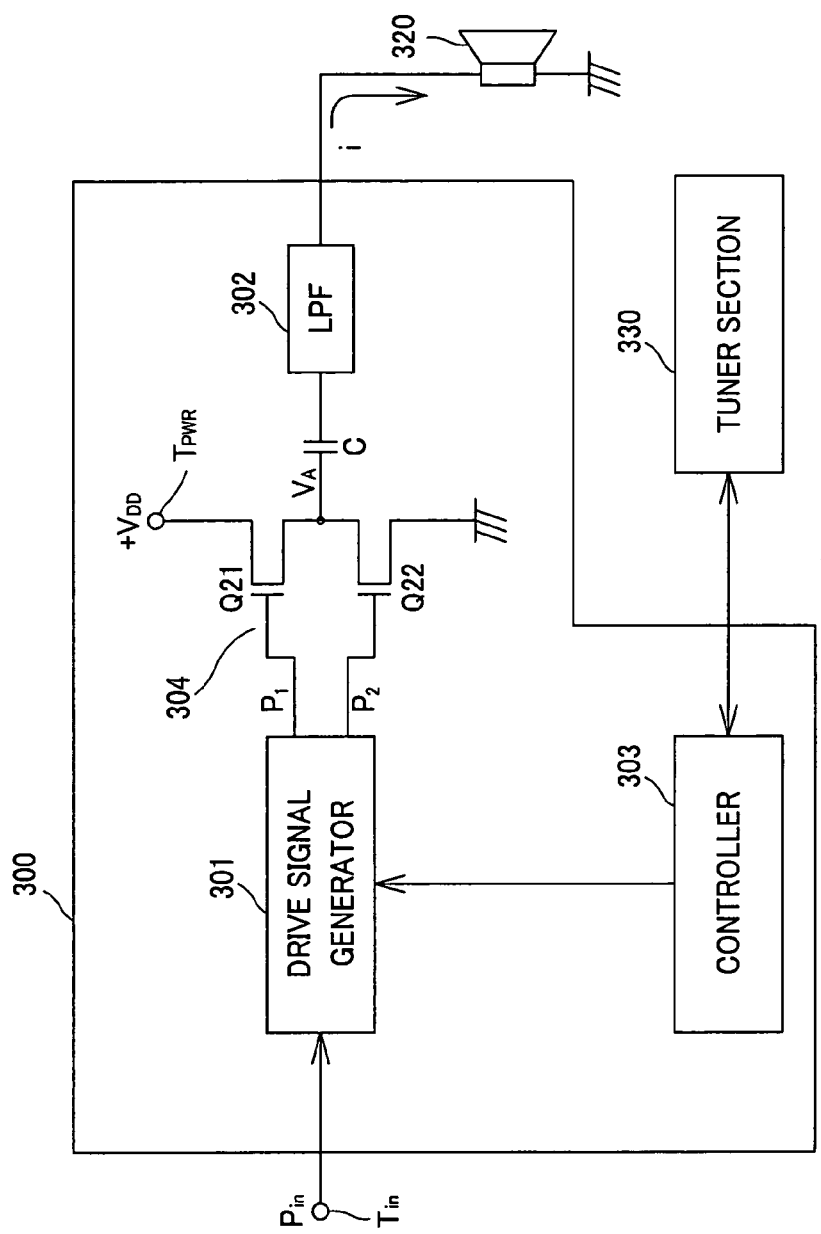
FIG. 9 is a view showing the configuration of a class D power amplifier according to a second embodiment.

Further, while an output stage of the power amplifier is configured as a BTL circuit in the first embodiment, it can be configured as a single circuit. FIG. 9 shows a power amplifier configured as a single circuit, i.e., a second embodiment of the present invention.

A digital audio signal $P_{in}$ of e.g., 16 bits is input to a class D power amplifier 300 shown in FIG. 9, which is the second embodiment of the present invention, through an input terminal $T_{in}$. A drive signal generator 301 also generates two types of drive signals $P_{1-1}$ and $P_{2-1}$, or $P_{1-2}$ and $P_{2-2}$ according to two types of drive signal generation systems.

The two types of drive signals $P_{1-1}$ and $P_{2-1}$, or $P_{1-2}$ and $P_{2-2}$ generated by the drive signal generator 301 are supplied to each gate of a pair of switching devices, e.g., n-channel MOS-FETs (Q21, Q22).

In this case, FETs (Q21, Q22) constitute a push-pull circuit 304, in which the drain of FET (Q21) is connected to a power terminal $T_{PWR}$, the source thereof is connected to the drain of FET (Q22), and the source of FET (Q22) is grounded. A stable direct-current voltage $+V_{DD}$ is supplied to the power terminal $T_{PWR}$ as a power source voltage. The direct-current voltage $+V_{DD}$ is, e.g., 20 to 50 V.

The source of FET (Q21) and the drain of FET (Q22) in the push-pull circuit 304 are connected to one end of a speaker 320 provided outside of the class D amplifier 300 through a coupling condenser C, and a low-pass filter (LPF) 302. The other end of the speaker 320 is grounded.

The drive signal generation system to be used in the drive signal generator 301 is selected by a controller 303 based on a received frequency of a tuner section 330. That is, the drive signal generator 301 generates, as needed, the two drive signals respectively according to the drive signal generation system that the controller 303 has selected based on a received frequency of the tuner section 330.

Figure 10:
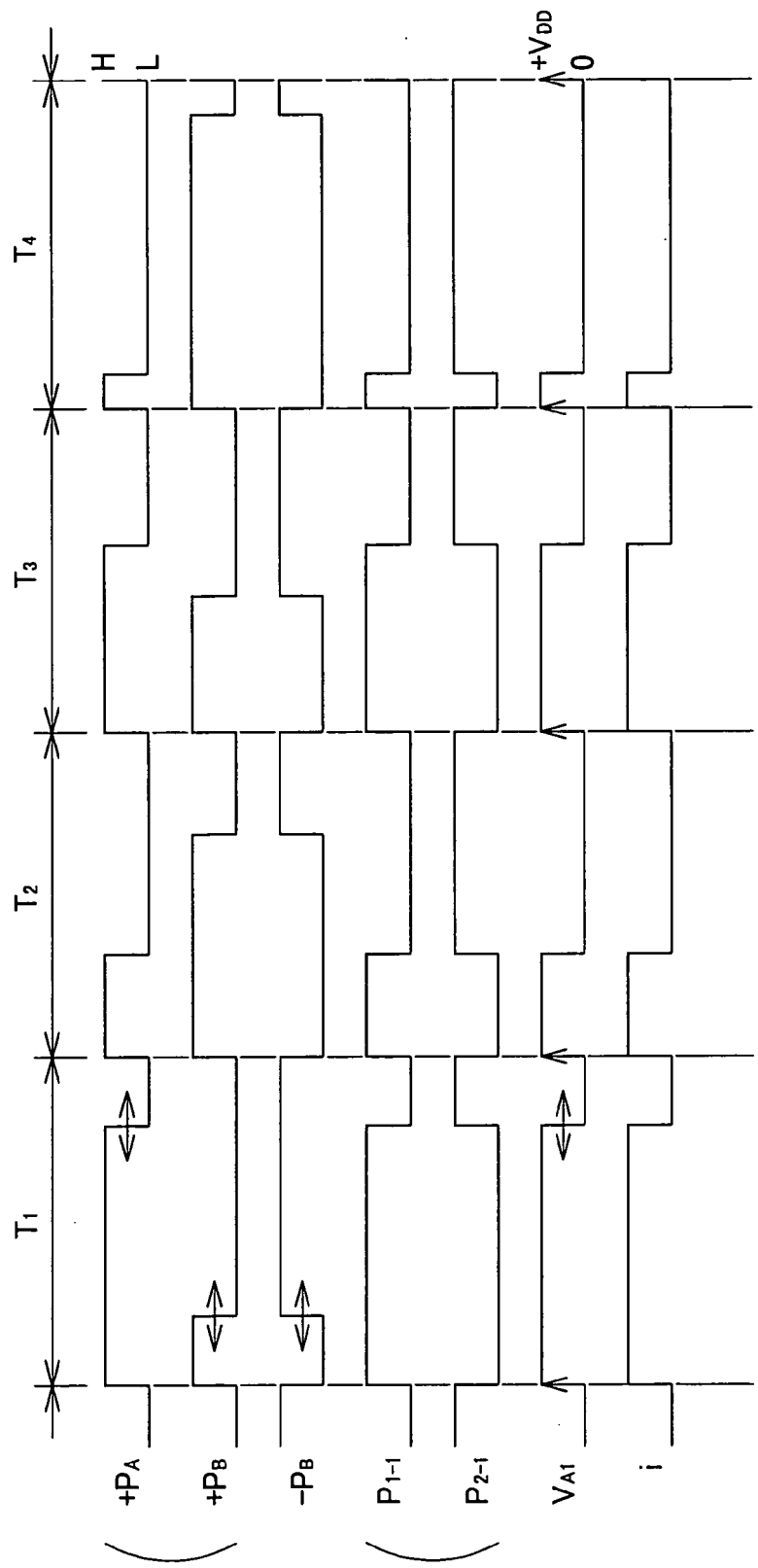
FIG. 10 is a timing chart for explaining a first drive signal generation system of two drive signal generation systems executed in two drive signal generators of the class D power amplifier according to the second embodiment.

A concrete example of the two drive signal generation systems executed in the drive signal generator 301 will be described below. Firstly, according to a first drive signal generation system (first drive signal generation system of the second embodiment), the drive signal generator 301 converts the digital audio signal $P_{in}$ supplied through the input terminal $T_{in}$ into PWM signals $+P_A$, $+P_B$. as shown in FIG. 10.

In this case, a pulse width of each of the PWM signals $+P_A$ and $+P_B$ changes according to the level (instantaneous level of the signal obtained by DA-converting the signal $P_{in}$, the same applies to the following description) of the input signal $P_{in}$. More specifically, as shown in FIG. 3, a pulse width of the PWM signal $+P_A$ corresponds to the level of the input signal $P_{in}$, and a pulse width of the PWM signal $+P_B$ corresponds to a twos complement of the level of the input signal $P_{in}$. Further, the rising time of the PWM signals $+P_A$ and $+P_B$ is fixed to the starting point of one cycle period $T_i$ (i=1, 2, 3, 4 . . . ) of the PWM signals $+P_A$ and $+P_B$, and the falling time thereof changes according to the level of the input signal $P_{in}$.

Assuming that a carrier frequency $f_c$ (=1/$T_i$) of the PWM signals $+P_A$ and $+P_B$ is e.g., 16 times a sampling frequency $f_s$ of the input digital audio signal $P_{in}$, where $f_s$=48 kHz, $$f_c=16f_s=16\times 48 \text{ kHz}=768 \text{ kHz}$$

is satisfied.

Figure 11:
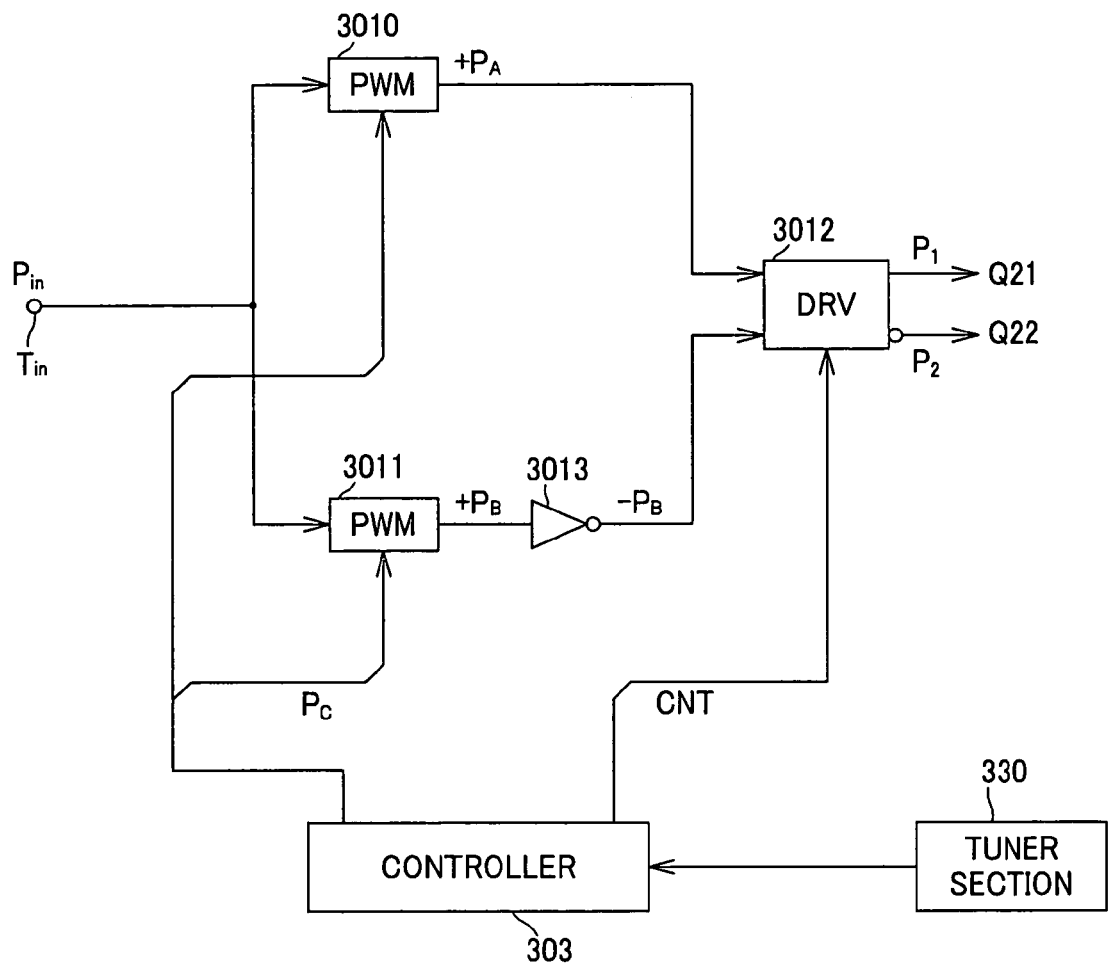
FIG. 11 a view showing an equivalent circuit at the time of execution of the first drive signal generation system according to the second embodiment.

In order to generate the above PWM signals $+P_A$ and $+P_B$, the first drive signal generation system according to the second embodiment operates equivalently to the circuit as shown in FIG. 11, in the drive signal generator 301.

The drive signal generator 301 includes a PWM modulation circuit 3010, a PWM modulation circuit 3011, a drive circuit 3012, and an inverter 3013, as shown in FIG. 11.

The PWM modulation circuit 3010 converts the audio signal into the PWM signal $+P_A$ of FIG. 10, and supplies the drive circuit 3012 with the converted signal. The PWM modulation circuit 3011 converts the audio signal into the PWM signal $+P_B$ of FIG. 10, and supplies the inverter 3013 with the converted signal. The inverter 3013 supplies the drive circuit 3012 with a PWM signal $-P_B$ obtained by inverting the level of the PWM signal $+P_B$.

When the first drive signal generation system according to the second embodiment is selected by the controller 303, the drive circuit 3012 supplies each gate of FETs Q21, Q22 that constitute the push-pull circuit 304 with the PWM signal $+P_A$ and its inverted signal $-P_A$ as the drive signal $P_{1-1}$ and $P_{2-1}$ as shown in FIG. 10.

When $P_{1-1}$="H", $P_{2-1}$="L". In this case, FET (Q21) is turned ON and FET (Q22) is turned OFF, so that the voltage $V_{A1}$ at the connection point between FETs (Q21, Q22) becomes a voltage $+V_{DD}$ as shown in FIG. 10. On the other hand, when $P_{1-1}$="L", $P_{2-1}$="H". In this case, FET (Q21) is turned OFF and FET (Q22) is turned ON, so that the voltage $V_{A1}$ becomes 0.

In the time period during which $V_{A1}=+V_{DD}$, a current i flows from the connection point between FETs (Q21, Q22) through the low-pass filter 302 and speaker 320, to the ground, as shown in FIG. 9.

The time period during which the current i flows changes in accordance with the time period during which the original PWM signal $+P_A$ rises, and the current i is integrated by the low-pass filter 302 when the current i flows through the speaker 320. As a result, the current i that flows through the speaker 320 becomes a power-amplified analog current that corresponds to the level of the input signal $P_{in}$. That is, the power-amplified output is supplied to the speaker 320.

Thus, in the class D power amplifier 300, the drive signal generator 301 of FIG. 9 operate equivalently to the circuit having the configuration shown in FIG. 11 using the first drive signal generation system according to the second embodiment. At this time, FETs (Q21, Q22) switch the power supply voltage $V_{DD}$ in response to the input digital audio signal $P_{in}$ to generate a power-amplified output, thereby improving efficiency and obtaining a large output.

The class D power amplifier 300, which includes the drive signal generator 301 shown in FIG. 9 operating according to the first drive signal generation system of the second embodiment to function as the circuit having the configuration of FIG. 11, switches the power supply voltage $+V_{DD}$ at high-speed to generate the output voltages $V_{A1}$. Therefore, in the class D power amplifier, radiation is generated by rising and falling edges of the output voltage $V_{A1}$. Further, the power supply voltage $+V_{DD}$ is a high voltage of e.g., 20 to 50 V at switching time, so that the radiation becomes significantly large. The carrier frequency $f_c$ of the PWM signal $+P_A$ is e.g., 768 kHz, as described above, which is contained in the medium wave broadcasting band e.g., AM radio broadcast band.

In the case where the class D amplifier 300 as mentioned above is integrated with an AM broadcast receiver or disposed at the vicinity of the AM broadcast receiver, like the case of a car audio system, radiation generated by rising and falling edges of the output voltage $V_{A1}$ may interfere with reception of e.g., AM broadcasting services.

To cope with the above problem, also in the class D power amplifier 300, the controller 303 selects a second drive signal generation system of the second embodiment to be described later as well as the first drive signal generation system of the second embodiment according to a received frequency in the tuner section 330 and allows the drive signal generator 301 to execute the selected system.

Figure 12:
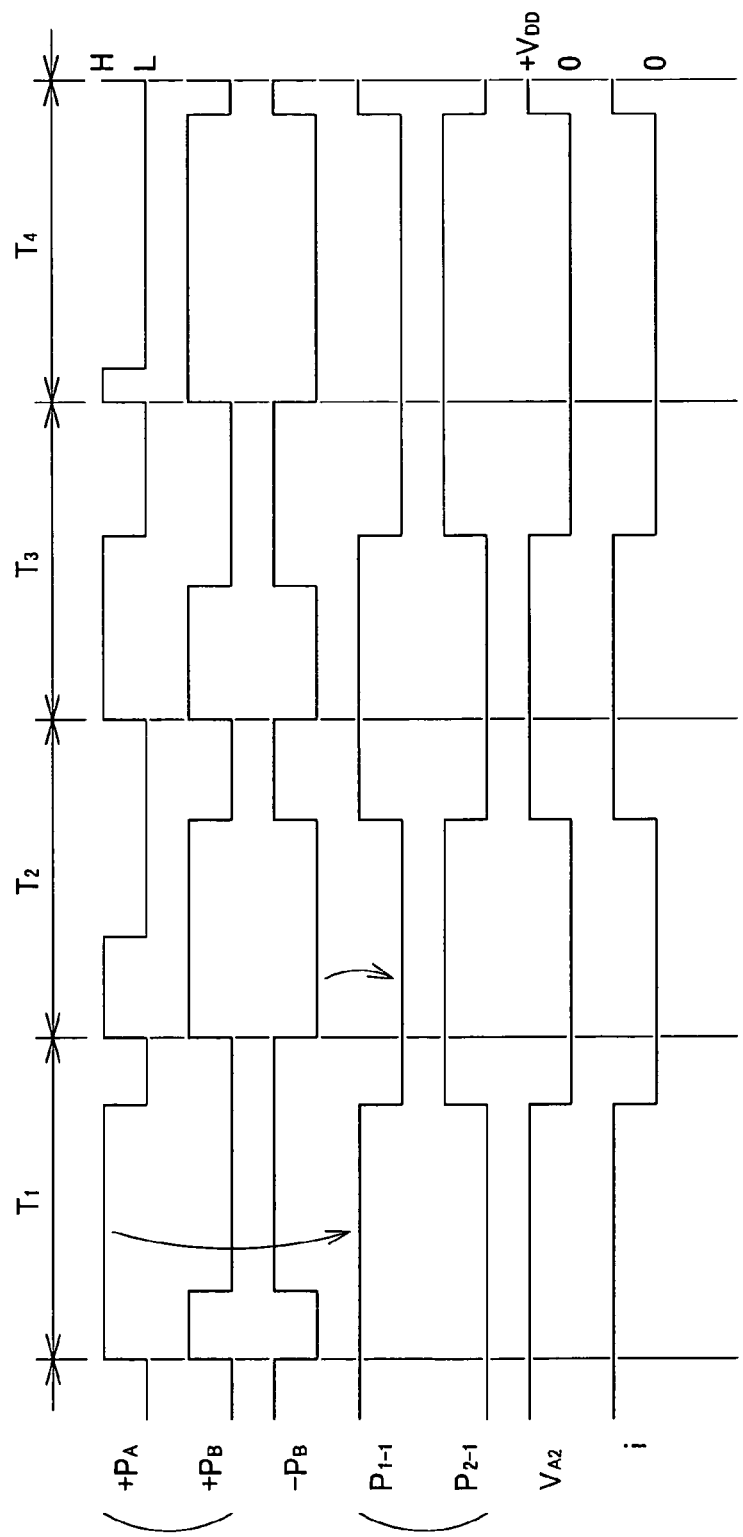
FIG. 12 is a timing chart for explaining a second drive signal generation system of two drive signal generation systems executed in the two drive signal generators of the class D power amplifier according to the second embodiment.

According to the second drive signal generation system, the drive signal generator 301 converts the digital audio signal $P_{in}$ supplied through the input terminal $T_{in}$ into the PWM signal $+P_A$ shown in FIG. 12. The drive signal generator 301 also converts the digital audio signal $P_{in}$ into the PWM signal $+P_B$ shown in FIG. 12 and generates a PWM signal $-P_B$ by inverting the level of the $+P_B$. Further, the drive signal generator 301 generates the drive signal $P_{1-2}$, $P_{2-2}$ as shown in FIG. 12 using the PWM signals $+P_{A1}$ $-P_B$.

In order to generate the above drive signals $P_{1-2}$, $P_{2-2}$, the second drive signal generation system operates equivalently to the circuit as shown in FIG. 11, in the drive signal generator 301.

When the second drive signal generation system is selected by the controller 303 in the circuit shown in FIG. 11, the drive circuit 3012 alternately takes out the PWM signals $+P_A$ and $-P_B$ every one cycle period $T_i$ to generate the drive signal $P_{1-2}$, as shown in FIG. 12. The drive signal $P_{2-2}$ is obtained by inverting the level of the drive signal $P_{1-2}$. The drive signals $P_{1-2}$ and $P_{2-2}$ are supplied to each gate of FET Q21, Q22 that constitute the push-pull circuit 304.

When $P_{1-2}$="H", $P_{2-2}$="L". In this case, FET (Q21) is turned ON and FET (Q22) is turned OFF, so that the voltage $V_{A2}$ at the connection point between FETs (Q21, Q22) becomes a voltage $+V_{DD}$, as shown in FIG. 12. On the other hand, when $P_{1-2}$="L", $P_{2-2}$="H". In this case, FET (Q21) is turned OFF and FET (Q22) is turned ON, so that the voltage $V_{A2}$ becomes 0.

In the time period during which $V_{A2}$=$+V_{DD}$, a current i flows from the connection point between FETs (Q21, Q22) through the low-pass filter 302 and speaker 320, to the ground, as shown in FIG. 9.

The time period during which the current i flows changes in accordance with the time period during which the original PWM signal $+P_A$ rises, and the current i is integrated by the low-pass filter 302 when the current i flows through the speaker 320. As a result, the current i that flows through the speaker 320 becomes a power-amplified analog current that corresponds to the level of the input signal $P_{in}$. That is, the power-amplified output is supplied to the speaker 320.

As described above, the class D power amplifier 300, which includes the drive signal generator 301 of FIG. 9 functioning as the circuit of FIG. 11 by executing the second drive signal generation system, amplifies power by switching operation. Further, it can be seen from FIG. 12 that although the PWM signals $+P_A$, $-P_B$ rise or fall every starting point of one cycle period $T_i$, the output voltage $V_{A2}$ does not rise every starting point of one cycle period $T_i$, and that the number of rising and falling edges of the output voltage $V_{A2}$ is ½ of the number of rising and falling edges of the output voltage $V_{A1}$, shown in FIG. 10. Therefore, it is possible to reduce the radiation generated by the change in the output voltage $V_{A2}$.

As described above with reference to FIGS. 7 and 8, switching between the first and second drive signal generation systems of the second embodiment in accordance with the received frequency of AM broadcasting services can reduce reception interference.

Also in this case, the class D amplifier can achieve its object only by switching the PWM modulation drive signal generation systems executed in a digital circuit such as the drive signal generator 301. Therefore, the drive signal generator can operate with a clock with high time axis precision such as a crystal oscillator.

In the class D power amplifier of FIG. 9, the output stage thereof is a single circuit, and only a direct-current voltage $+V_{DD}$ is used as a power supply voltage of the push-pull circuit 304. Alternatively, however, the push-pull circuit 304 may use positive and negative power supplies $+V_{DD}$, $-V_{DD}$ as shown in FIG. 13 in the class D power amplifier.

Figure 13:
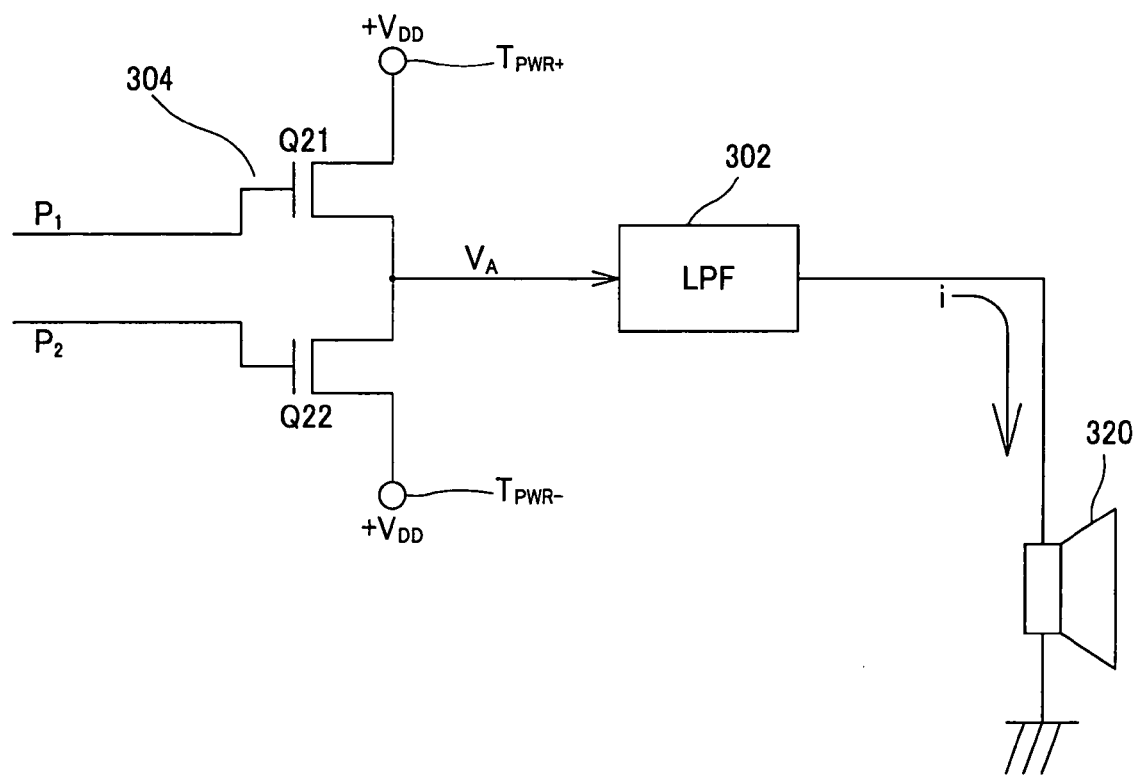
FIG. 13 is a circuit diagram showing a main part of a modification of the class D power amplifier in which an output stage thereof is a single circuit and positive and negative power supplies $+V_{DD}$, $-V_{DD}$ are used.

In FIG. 13, the drain of FET (Q21) of the push-pull circuit 304 is connected to a power supply terminal $T_{PWR+}$, and the source of FET (Q22) is connected to a power supply terminal $T_{PWR-}$. A pair of positive and negative direct current voltages $+V_{DD}$, $-V_{DD}$ are supplied, respectively to the power supply terminals $T_{PWR+}$, $T_{PWR-}$, as a power supply voltage.

Figure 14:
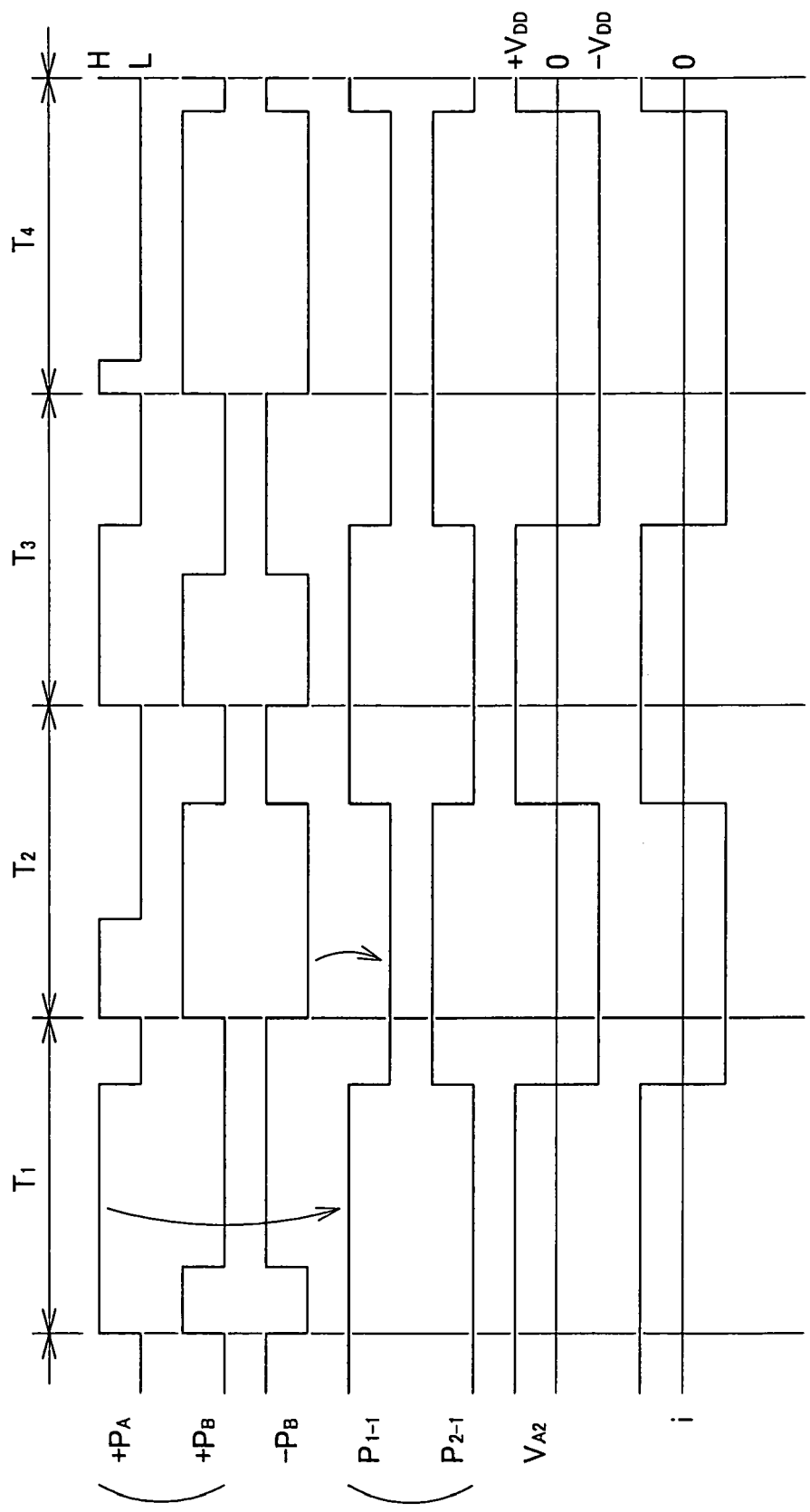
FIG. 14 is a timing chart for explaining a second drive signal generation system according to the modification.

Therefore, when the class D power amplifier including a main part shown in FIG. 13 is driven by the second drive signal generation system, the waveform of the output voltage $V_{A2}$ of the push-pull circuit 304 becomes as shown in FIG. 14 in response to the drive voltage $P_{1-2}$, $P_{2-2}$. As a result, a current i having the polarity and size corresponding to the input signal $P_{in}$ flows into the speaker 320, thereby amplifying power.

Further, also in this class D power amplifier, although the PWM signals $+P_A$, $-P_B$ rise or fall every starting point of one cycle period $T_i$, the output voltage $V_{A2}$ does not rise every starting point of one cycle period $T_i$, and that the number of rising and falling edges of the output voltage $V_{A2}$ is ½ of the number of rising and falling edges of the output voltage $V_{A1}$, shown in FIG. 10. Therefore, it is possible to reduce the radiation generated by the change in the output voltage $V_{A2}$.

As described above with reference to FIGS. 7 and 8, switching between the first and second drive signal generation systems in accordance with the received frequency of AM broadcasting services can reduce reception interference.

Also in this case, the class D power amplifier switches the PWM modulation drive signal generation systems executed in a digital circuit. Therefore, the drive signal generator can operate with a clock with high time axis precision such as a crystal oscillator.

In either case of the first drive signal generation system or the second drive signal generation system under the configuration as shown in FIG. 9, the center of gravity of the current waveform to be supplied to the speaker 320 is off-center in terms of time within one cycle period $T_i$, so that phase distortion occurs. The term "center of gravity is not off-center" here denotes that the peak of the waveform is aligned with the center of one cycle period. In this example, the waveform is left-sided or right-sided for each cycle. This deteriorates characteristics, although the required output level is obtained every one cycle period Ti.

In order to solve this problem, a method of modulating a pulse width on both sides of one cycle period in accordance with the level of the input signal $T_{in}$ at the time when the PWM signal is generated in the drive signal generator is considered, in the configuration as shown in FIG. 9, in which the output stage is a single circuit. This method modulates a pulse width on both sides of one cycle period, so the method is referred to as "both-side-modulation". Also in this both-side-modulation, a drive signal having one rising edge and one falling edge for each one cycle period is generated. By generating a drive signal of the push-pull circuit 304 based on the PWM signal PDA obtained by the both-side-modulation and supplying FETs (Q21, Q22) with the generated drive signal, an output voltage V in which the center of gravity is aligned with the center of one cycle period $T_i$ in terms of time can be generated.

As described above, according to the system of generating a drive signal from the PWM signal obtained by the both-side-modulation, it is possible to obtain characteristics in which there is no phase distortion even in the configuration in which the output stage is a single circuit. In the drive signal generation system using the both-side-modulation, the pulse width must be controlled on both sides of one cycle period in accordance with the level of the input signal, resulting in somewhat complicated control. However, it is possible to use the both-side-modulation as the first drive signal generation system.

The present invention is not limited to the above embodiment described with reference to the accompanying drawings, and it will be apparent to those skilled in the art that various modifications, substitutions or the one equivalent to them can be made without departing from the claims appended hereto and the spirit and scope of the invention.

INDUSTRIAL APPLICABILITY

In the present invention, drive signal generation systems, which is a means for generating a drive signal, are selectively switched in accordance with a received frequency of a tuner for receiving radio broadcasts. Based on the drive signal generated according to the selected drive signal generation system, a push-pull means obtains an output signal, from which a power amplified signal is obtained. As a result, it is possible to suppress unnecessary radiation to reduce reception interference with respect to the tuner without changing a carrier frequency.

The invention claimed is:

1. A power amplifier having at least push-pull means obtained by push-pull connecting a pair of switching devices, and amplifying the power of an input signal using the push-pull means, comprising:
   drive signal generation means for producing a pulse width modulation signal which represents the level of the input signal by a pulse width, and generating, based on the pulse width modulation signal, a drive signal to be supplied to the push-pull means, wherein
   the push-pull means generates an output signal based on the drive signal generated according to the selected drive signal generation system, and a power amplified signal is obtained from the output signal, wherein
   the drive signal generation system includes first and second systems, the first system generating a drive signal that changes at separation points of each cycle period of the pulse width modulation signal, and the second system generating a drive signal that does not change at separation points of each cycle period.

2. The power amplifier according to claim 1, wherein drive signal generation systems in the drive signal generation means are selectively switched in accordance with a received frequency of a tuner for receiving radio broadcasts.

3. The power amplifier according to claim 1, comprising two push-pull means, and two drive signal generation means for supplying, respectively, the drive signals to the two push-pull means.

4. The power amplifier according to claim 3, wherein a power amplified signal is obtained from the two output signal obtained by supplying the two push-pull means with the respective drive signals generated by the two drive signal generation means.

* * * * *